United States Patent
Lee et al.

(10) Patent No.: US 9,887,697 B2
(45) Date of Patent: Feb. 6, 2018

(54) GATE DRIVE CIRCUIT TO REDUCE PARASITIC COUPLING

(71) Applicant: GE Energy Power Conversion Technology Ltd., Rugby, Warwickshire (GB)

(72) Inventors: Christopher Joseph Lee, Pittsburgh, PA (US); Luke Anthony Solomon, Pittsburgh, PA (US); Alfred Permuy, Massy (FR)

(73) Assignee: GE ENERGY POWER CONVERSION TECHNOLOGY LTD (GB)

( * ) Notice: Subject to any disclaimer, the term of this patent is extended or adjusted under 35 U.S.C. 154(b) by 0 days.

(21) Appl. No.: 15/147,920

(22) Filed: May 6, 2016

(65) Prior Publication Data

US 2016/0329889 A1  Nov. 10, 2016

(30) Foreign Application Priority Data

May 7, 2015 (FR) ...................... 15 54105

(51) Int. Cl.
*H03K 17/61* (2006.01)
*H02M 1/088* (2006.01)
(Continued)

(52) U.S. Cl.
CPC ........... *H03K 17/61* (2013.01); *H03K 17/107* (2013.01); *H03K 17/162* (2013.01);
(Continued)

(58) Field of Classification Search
CPC ........ H02M 1/00; H02M 1/088; H03K 17/00; H03K 17/04126; H03K 17/063;
(Continued)

(56) References Cited

U.S. PATENT DOCUMENTS 3,927,365 A * 12/1975 Kodama .............. H03K 17/601
307/17
H000275 H    5/1987 Milberger et al.
(Continued)

FOREIGN PATENT DOCUMENTS

CA    2833017 A1    10/2012
EP    0724332 A1     7/1996
(Continued)

OTHER PUBLICATIONS

Great Britain's Combined Search & Examination Report issued in connection with corresponding GB Application No. 1607876.8 dated Oct. 31, 2016.
(Continued)

*Primary Examiner* — Lincoln Donovan
*Assistant Examiner* — David Mattison
(74) *Attorney, Agent, or Firm* — GE Global Patent Operation; Scott R. Stanley

(57) ABSTRACT

A drive circuit including a first transformer unit in connection with a pulse amplifier module and a second transformer unit in connection with a plurality of power semiconductor groups, each group containing one or more power devices. The first transformer unit includes at least one primary transformer configured to receive a current pulse at a primary winding from a current pulse generation module, the current pulse being reflected to a secondary winding. The second transformer unit includes a plurality of secondary transformers where each secondary transformer is configured to receive the current pulse at a primary winding thereof, the current pulse being reflected to a secondary winding coupled to a pulse receiver module. The first and second transformer units reduce parasitic coupling between the pulse receiver module and the control module.

16 Claims, 4 Drawing Sheets

(51) Int. Cl.
   *H03K 17/567*     (2006.01)
   *H03K 17/691*     (2006.01)
   *H03K 17/10*      (2006.01)
   *H03K 17/16*      (2006.01)

(52) U.S. Cl.
   CPC ......... *H03K 17/165* (2013.01); *H03K 17/168* (2013.01); *H03K 17/567* (2013.01); *H03K 17/691* (2013.01); *H02M 1/088* (2013.01)

(58) Field of Classification Search
   CPC ............ H03K 17/0826; H03K 17/107; H03K 17/162; H03K 17/165; H03K 17/168; H03K 17/567; H03K 17/601; H03K 17/61; H03K 17/691; H03K 2217/00; H03K 2217/0036
   USPC ........................................................ 327/109
   See application file for complete search history.

(56) References Cited

U.S. PATENT DOCUMENTS

| | | | |
|---|---|---|---|
| 8,471,604 B2 | 6/2013 | Permuy et al. | |
| 2013/0099831 A1* | 4/2013 | Permuy | H03K 17/10 327/109 |
| 2013/0271187 A1 | 10/2013 | Hayashi et al. | |

FOREIGN PATENT DOCUMENTS

| | | |
|---|---|---|
| EP | 2787625 A1 | 10/2014 |
| GB | 2183952 A | 6/1987 |
| JP | 2002093628 A | 3/2002 |
| JP | 2006109686 A | 4/2006 |

OTHER PUBLICATIONS

FR Search Report and Written Opinion in Connection with corresponding Application No. 1554105 dated Mar. 3, 2016.

* cited by examiner

GATE DRIVE CIRCUIT TO REDUCE PARASITIC COUPLING

FIELD OF INVENTION

Embodiments of the present invention relate to a power electronic system that employs a transformer based gating system for voltage isolated active power devices.

BACKGROUND OF THE INVENTION

A number of different power conversion systems convert power from one form to another. For example, a multilevel power inverter is a power electronic device structured to produce alternating current (AC) waveforms from a direct current (DC) input voltage. These power conversion systems are used in a wide variety of applications, such as variable speed motor drives.

Isolation, and independent control within power conversion systems, is provided by gate drive circuitry. Gate drive circuits convert logic level control signals into appropriate voltages for switching one or more power devices within a power semiconductor group. In most cases, these circuits provide voltage isolation to prevent exposure of the logic signals to potentially dangerous high voltages on the power circuit.

Many conventional techniques provide isolation and control functionality via gate drive circuits. For example, one technique transfers a voltage directly across a barrier, via a transformer, while maintaining galvanic isolation. When using a transformer, a voltage common to terminals of the secondary is produced when a voltage step occurs within the power semiconductor group. This common voltage causes parasitic currents to flow through the control circuit, which can cause failure or unintended operation. Another technique uses fiber optic transmission for creating the digital on-off signal, while transferring power separately with an isolated power source. These conventional techniques, however, are costly and lack precision synchronization for controlling series connected power semiconductor devices (e.g., switches).

SUMMARY OF THE INVENTION

Given the aforementioned problem, a need exists for systems and methods that provide precise synchronization for controlling series connected power devices for circuits to perform in high voltage environments with a significant amount of rate of change in voltage with respect to time.

Embodiments of the present invention includes a drive circuit, for driving an electrical system. The drive circuit includes a first transformer unit in connection with a pulse amplifier module and a second transformer unit in connection with a plurality of power semiconductor groups, each group containing one or more switching devices. The first and second transformers provide voltage isolation and reduce parasitic coupling between the control module and the pulse receiver module. With each additional transformer added in series between the first primary winding and last secondary winding, additional capacitance is added to the electrical system. Therefore, the collective capacitance between the first primary and the last secondary windings is decreased.

The first transformer unit includes at least one primary transformer configured to receive a current pulse at a primary winding from a current pulse generation module controlled by a control module. Additionally, the current pulse is reflected to a secondary winding.

The second transformer unit includes a plurality of secondary transformers where each secondary transformer is configured to receive the current pulse at a primary winding. Additionally, the current pulse is reflected to a secondary winding coupled to a pulse receiver module.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

DETAILED DESCRIPTION

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either, any, several, or all of the listed items.

The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
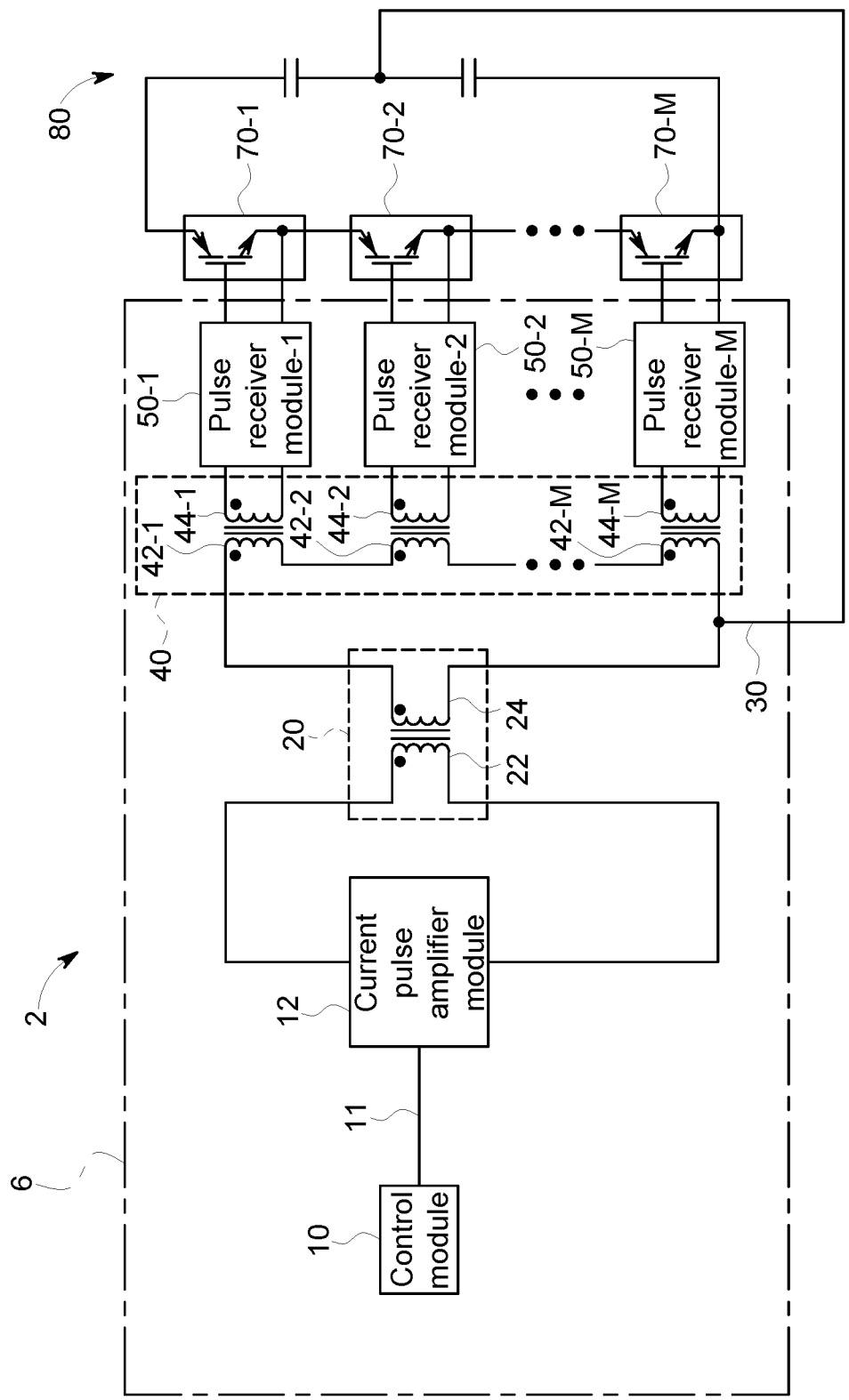
FIG. 1 is a schematic diagram of an exemplary embodiment of an electronic system in accordance with an embodiment of the present invention.

FIG. 1 is an illustration of an exemplary electronic system 2 including a drive circuit 6 connected to a plurality of semiconductor groups 70. The drive circuit 6 includes a control module 10, a current pulse amplifier module 12, a first transformer unit 20, and a second transformer unit 40.

Control module 10 of gate drive circuit 6 includes one or more devices capable of generating logic level control signals based on particular programming. According to an embodiment, control module 10 is programmed to generate a number of logic level signals for shaping a current pulse to be output to the current pulse amplifier module 12. As described below, the current pulse is used to produce the voltage signals driving power devices of each semiconductor group 70.

The power devices are semiconductors used as a switch or a rectifier capable of being selectively changed between a non-conducting (off) state and a conducting (on) state as commanded by a control input signal, and shall include, for example thyristors, bipolar junction transistors (BJTs), insulated gate bipolar transistors (IGBTs), or a metal oxide semiconductor field-effect transistors (MOSFETs), among others. The power devices can be classified into two categories with respect to drive requirements, namely non-gate oxide-isolated active power semiconductor devices and gate oxide-isolated active power semiconductor devices.

The control module 10 communicates with the current pulse amplifier module 12 by way of one or more logic signals 11. The current pulse amplifier module 12 outputs current pulses based on the logic signals 11, output from the control module 10.

Figure 2:
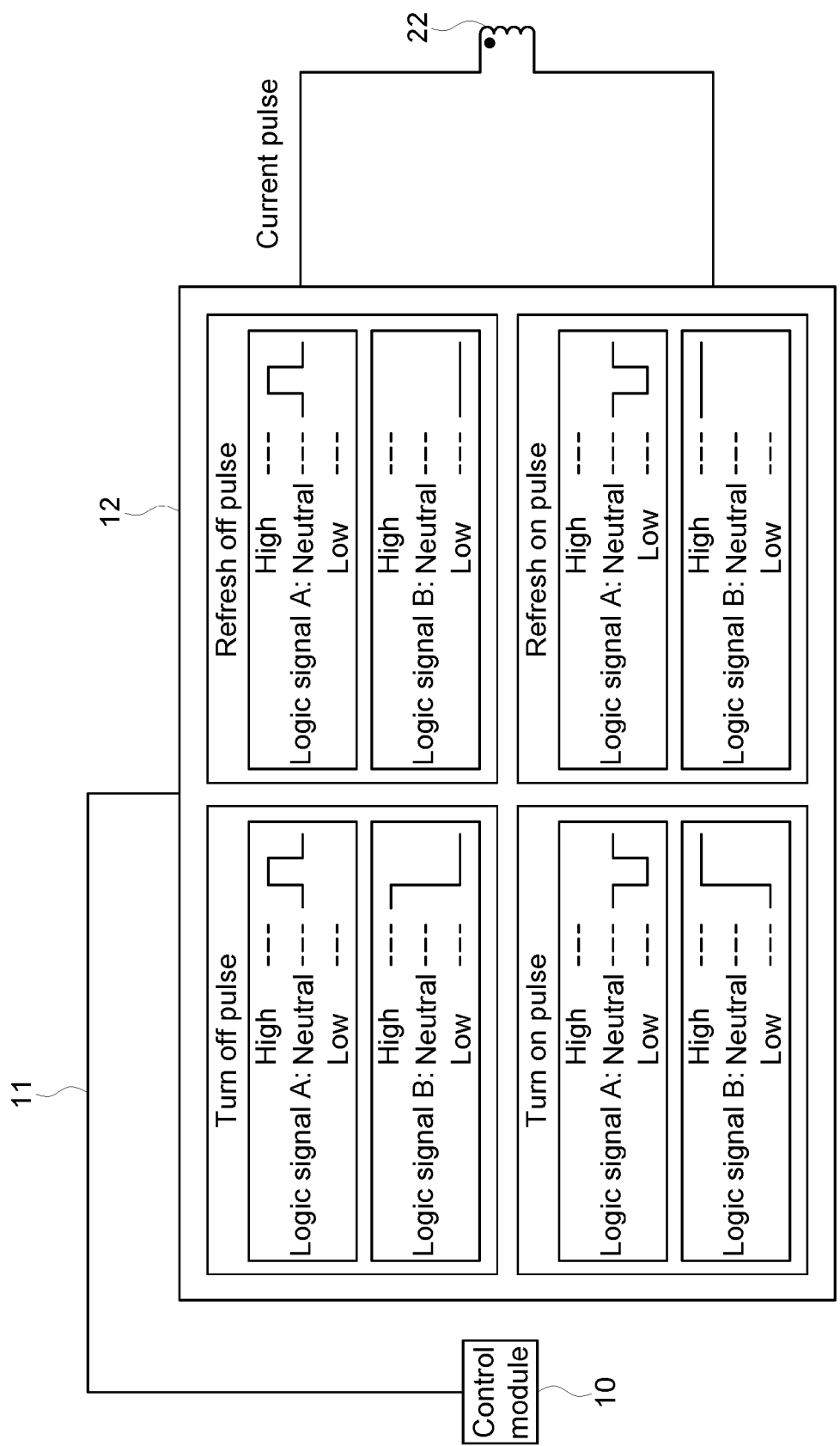
FIG. 2 is a schematic diagram illustration of logical level signals determining four types of current pulses in the gate drive circuit of the electronic system of FIG. 1.

As illustrated in FIG. 2, the logic signals 11 may include one of any number of current pluses, that transitions through three logical states (e.g., High, Low, Neutral). The current pulse, for example, can include (i) a Turn Off Pulse that transitions each semiconductor within each semiconductor group 70 from a conducting (on) state to a non-conducting (off) state. The current pulse can also include a (ii) a Turn On Pulse, that transitions each semiconductor of each semiconductor group 70 from a non-conducting state to a conducting state, and (iii) a Refresh Off Pulse, that maintains each semiconductor of each semiconductor group 70 in a non-conducting state when the power devices are already in an Off state. Additionally, (iv) a Refresh On Pulse maintains each semiconductor of each semiconductor group 70 in a conducting state when the power devices are already in an On state.

As depicted in FIG. 2, the control module 10 outputs two types (turn off, and turn on pulses) of logic signals 11 to the current pulse amplifier module 12, each representing a type of current pulse. For example, a logic signal A transitions through three logical states (e.g., High, Low, Neutral) and another logic signal 11 (Logic Signal B) only transitions through two logical states (e.g., High, Low).

In the electronic system 2 of FIG. 2, logic signal B produces a zero volt state across the first transformer unit 20 when logic signal A is in the neutral state. This arrangement ensures the second transformer unit 40 does not pull charge from gates of switches within the semiconductor groups 70 after the current pulse has been released.

The current pulse produced by logic signal A, and provided to the current pulse amplifier module 12, is provided to windings of the transformer unit 20, specifically to primary windings 22. In response, a current pulse is reflected on secondary windings 24 of the first transformer unit 20. In other words, provision of the current pulse generated by logic signal A to the primary windings 22 will result in M substantially identical reflected current pulses scaled by the secondary windings 24 to a turns ratio at the secondary windings 24.

One advantage of using the first transformer unit 20 in this manner is that it provides the M reflected current pulses at the secondary windings 24 in a synchronized manner while simultaneously providing voltage isolation between control module 10 and logic signal to the current pulse amplifier module 12 and the higher (potentially dangerous) voltage of active power semiconductor groups 70.

The first transformer unit 20 includes primary windings 22 coupled to secondary windings 24. In some embodiments, the primary windings 22 are identical to one another and the secondary windings 24 are identical to one another (e.g., the same magnetic core, turns ratio, and leakage inductance is employed). In other embodiments, however, the primary windings 22 and the secondary windings 24 may differ from one another.

In high common mode environments, parasitic capacitive coupling between the semiconductor groups 70 and the drive circuit 6 can negatively affect the performance of the system 2, resulting in failure or unintended operation of components of the drive circuit 6. Specifically, a high rate of change in voltage with respect to time (dv/dt) of the power semiconductors causes a large voltage step to develop on primary windings (e.g., primary windings 42 of the second transformer unit 40), with respect to a control voltage reference node. This voltage step results in a flow of a common mode current from the power devices within the semiconductor groups 70 towards the current pulse amplifier module 12 and the control module 10. This common mode current can interrupt typical switching of low-voltage power devices within the pulse amplifier module 12, for example, and result in unintended operation of those low-voltage power devices. Additionally, unintended operation may lead to failure of the power devices within the semiconductor groups 70.

Additionally, common mode voltage isolation is not present within the system 2. Common mode voltage can cause common mode current flow through low voltage electronics and ground loops in measurement systems that have multiple grounding locations. Common mode voltage that exceeds the maximum an overvoltage rating of the switches within the semiconductor groups 70 may damage components of the drive circuit 6.

Presence of the first transformer unit 20 reduces the dv/dt stresses of the control module 10 that occur when the power devices within the semiconductor groups 70 switch by increasing common mode impedance within the system 2. For example, the first transformer unit 20 lowers capacitance between the control module 10 and the power devices within the semiconductor groups 70. Including a transformer winding in series increases capacitance of the drive circuit 6 by virtue of series capacitance and thus decreases the overall capacitive coupling between the first primary winding and the last secondary winding.

Figure 3:
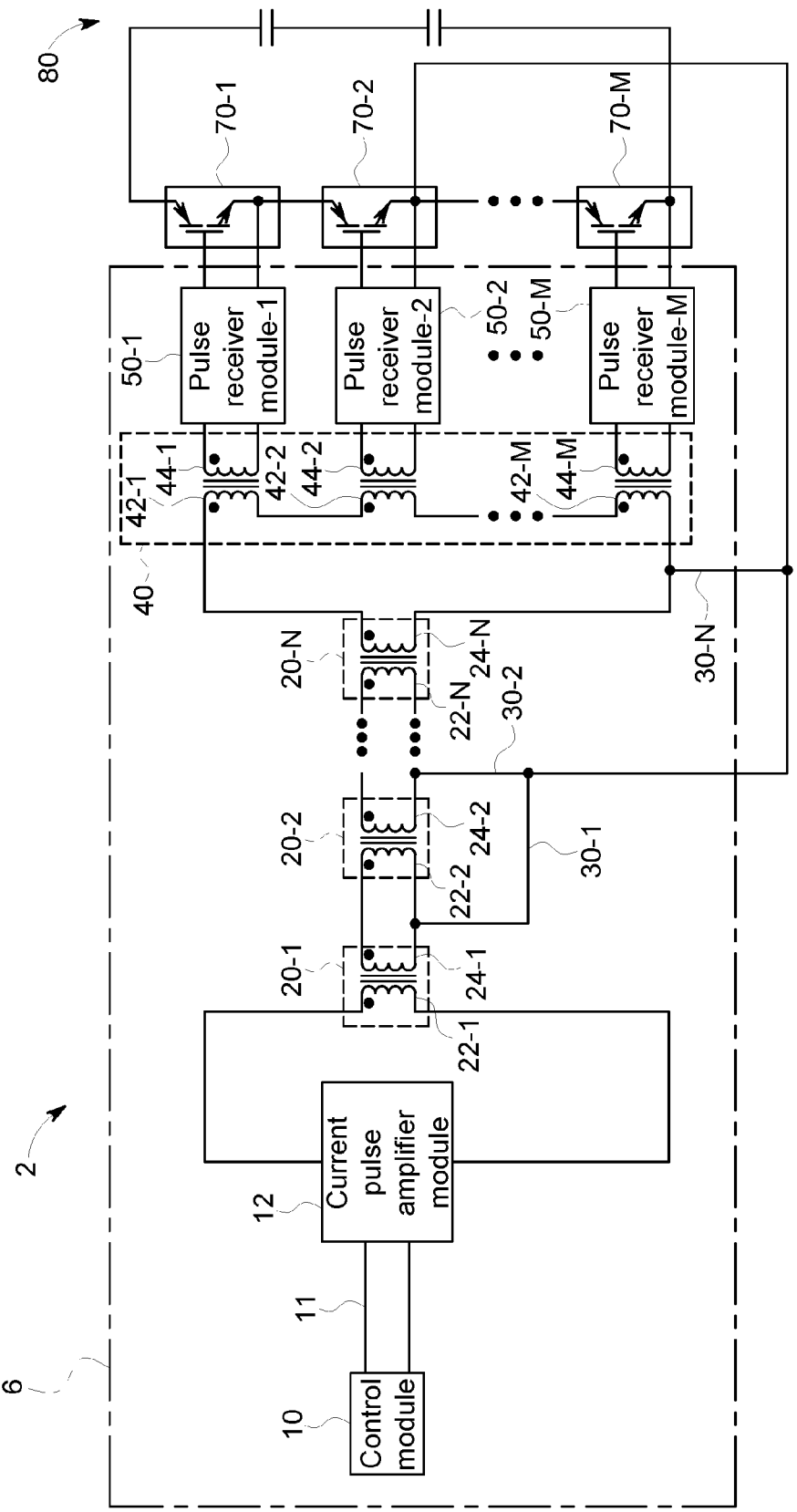
FIG. 3 is a schematic diagram of illustration of an electronic system in accordance with a second embodiment of the present invention.
Figure 4:
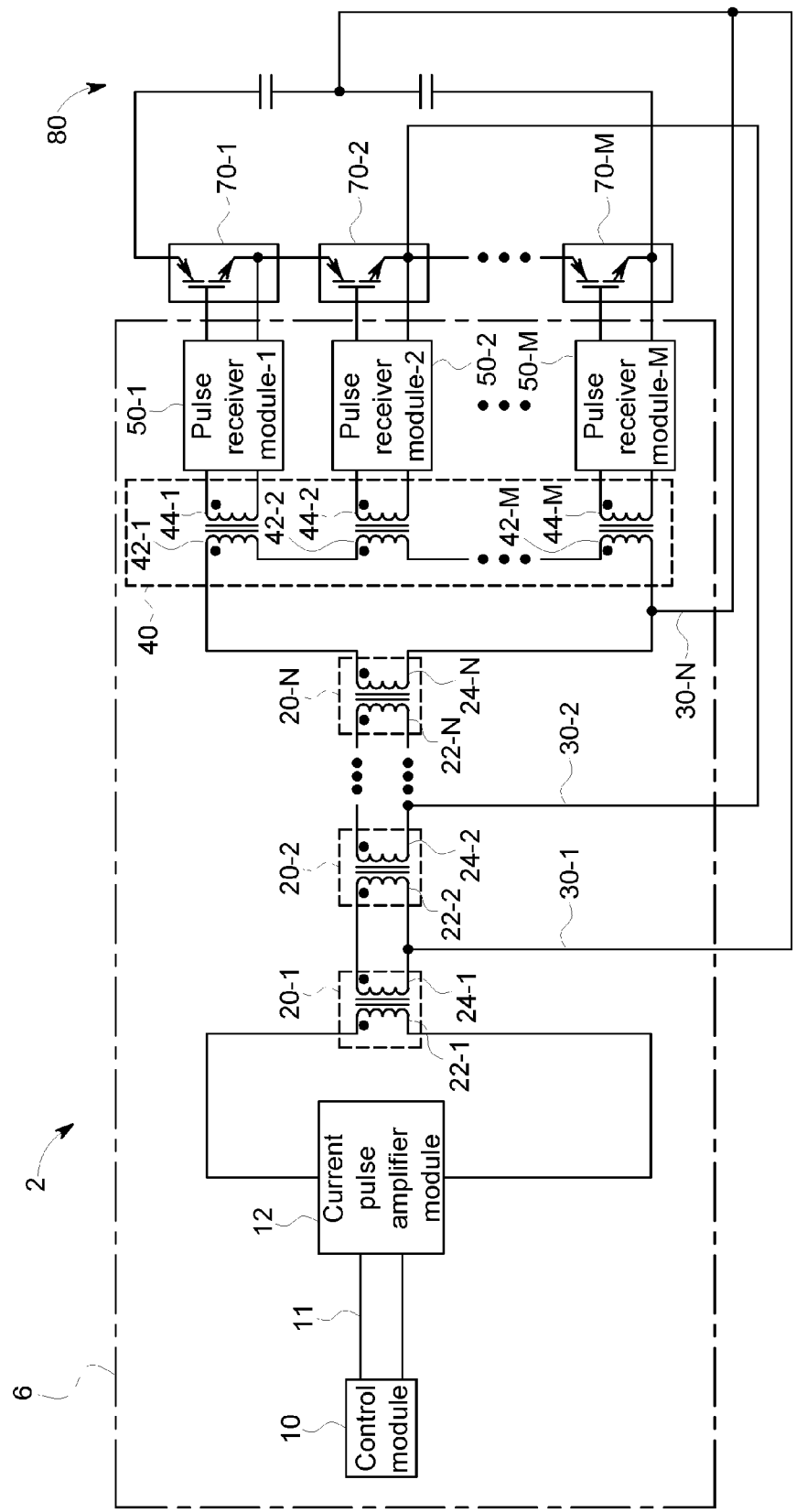
FIG. 4 is a schematic diagram of illustration of an electronic system in accordance with a third embodiment.

In other embodiments, as illustrated in FIGS. 3 and 4, the first transformer unit 20 can include up to N primary windings 22 (labeled 1 through N) coupled to N secondary windings 24 (labeled 1 through N). Each of the M primary windings 22 is identical to other primary windings 22. Similarly, each of the M secondary windings 24 is identical to other secondary windings 24 (i.e., the same magnetic core, turns ratio, and leakage inductance is employed). The transformers of the first transformer unit 20 are implemented using toroids.

Each primary winding 22 (1 through N) of second transformer unit 40 may wired in parallel to allocate current. In parallel configurations, the output of the logic signal 11 to the current pulse amplifier module 12 is provided to the primary winding 22 of a first transformer 20-1 within the first transformer unit 20. The transformers of the second transformer unit 40 are implemented using toroids.

Alternatively, the primary windings 22 (1 through N) can be connected to one another in series so that all transformers within the first transformer unit 20 will have the same current. In series configurations, the output of logic signal 11 to the current pulse amplifier module 12 is provided to each primary winding 22 of first transformer unit 20 such that each primary winding 22 will receive the same signal (i.e., the same current pulse) output from the current pulse amplifier module 12.

In some embodiments, a loop 30 connects the first transformer unit 20 and the second transformer unit 40. Specifically, the loop 30 connects the secondary windings 24 of the first transformer unit 20 to a potential within the system 2. By connecting the first transformer unit 20 to a potential within the system 2, capacitive coupling is decreased.

In other embodiments, the loop 30 is connected to a potential located at a midpoint of the system 2. An example configuration, as illustrated in FIG. 1, depicts the loop 30 in connection connects to a DC link 80 of the system 2.

Specifically, the loop 30 provides additional pathways of current flow back to the source of the common mode voltage and allows the common mode current to be directed away from gating electronics (e.g., the gate circuit 2). The loop 30 provides a low impedance path from the semiconductor group 70 back to the source of the reference node of the voltage step change. The connection of the drive circuit 6 to a voltage potential results in a higher parasitic impedance from the current pulse amplifier module 12 back to the loop 30 rather than through the same connection at the primary windings 42, resulting in current flow along a path of least impedance that circumvents electronics within the control module 10.

Where multiple transformers exist in the first transformer unit 20, as illustrated in FIGS. 3 and 4, each of the first transformer units 20-1 through 20-N have an associated loop 30 (labeled 1 through N). Each of the loops 30-1 through 30-N are connected to a voltage potential of the system 2.

In some multiple transformer embodiments, each loop 30 may be connected to the same potential within the system 2. For example, the loops 30-1 through 30-N may be connected to the midpoint of a DC link 80. In another example, illustrated in FIG. 3, the first loop 30-1, the second loop 30-2, and the Nth loop 30-N may each be in connection with one of the semiconductor groups 70 (e.g., 70-2 as illustrated).

In some multiple transformer embodiments, one or more loops 30 can be connected to different potentials within the system 2. For example, as illustrated in FIG. 4, the loops 30-1 and 30-N are connected to the midpoint of the DC capacitor link 80. However, the loop 30-2 is connected to the second semiconductor group 70-2.

The drive circuit 6 also includes the second transformer unit 40. The second transformer unit 40 receives pulses from the current pulse amplifier module 12 by way of the first transformer unit 20.

The second transformer unit 40 comprises M primary windings 42 (labeled 1 through M) coupled to M secondary windings 44 (labeled 1 through M, in the manner described above).

The primary windings 42-1 through 42-M of the second transformer unit 40 are connected in series so that all transformers within the second transformer unit 40 will have the same signal (current pulse). That is, current pulses received by the primary windings 42 of the second transformer unit 40 will result in M substantially identical reflected current pulses scaled by the secondary to primary turns ratio at the secondary windings 44.

A benefit of using the second transformer unit 40 in this manner is that it provides the M reflected current pulses at the secondary windings 44 in a synchronized manner. This occurs while simultaneously adding capacitance in series between the control module 10 and logic signal to the current pulse amplifier module 12 and the higher (potentially dangerous) voltage of semiconductor groups 70. That is, the first transformer unit 20 and the second transformer unit 40 collectively increase the common mode impedance between the control module 10 and each of the pulse receiver modules 50-1 through 50-M.

Each of the secondary windings 44-1 through 44-M of the second transform unit 40 connects to M pulse receiver modules 50 (labeled 1 through M). Each pulse receiver module 50 is coupled to gate(s) of the switches of an associated one of the semiconductor groups 70.

Each pulse receiver module 50 transfers and latches the received current pulse appropriate for driving the switches of the associated semiconductor group 70. More specifically, each pulse receiver module 50 performs two main functions on the received current pulses to establish a voltage (e.g., gate-to-emitter voltage) to drive switches of the semiconductor groups 70 either conducting (on state) or not conducting (off state).

First, the pulse receiver module 50 sets up and clamps to an on state gate-to-emitter voltage for a positive current pulse. Likewise, the pulse receiver module 50 sets up and clamps to an off state gate-to-emitter voltage for a negative current pulse.

Second, the pulse receiver module 50 remains at the on state or off state gate-to-emitter voltage after the current pulse has ended so that the switches within an active power semiconductor group 70 can remain in either the on state or off state, respectively. This prevents a flux reset action of the second transformer unit 40 from inadvertently disturbing the proper on state and off state gate-to-emitter voltages.

Components within the electronic system 2 may be hardened to electromagnetic interference (EMI) to be more robust against the presence of electromagnetic waves in the air. Such EMI hardened components may prevent detected signals from propagating to the connected circuitry on the drive circuit 6.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A drive circuit, for driving a plurality of power semiconductor devices, comprising:
   a first transformer unit having at least one primary transformer configured to receive a current pulse at a primary winding from a current pulse generation module, the current pulse being reflected to a secondary winding of the primary transformer; and
a second transformer unit having a plurality of secondary transformers where each secondary transformer is configured to receive the current pulse at a primary winding thereof, the current pulse being reflected to a secondary winding of the secondary transformer coupled to a pulse receiver module,
wherein the first and second transformer units reduce parasitic coupling between a control module and the pulse receiver module;
wherein the primary transformers of the first transformer unit or the secondary transformers of the second transformer unit are implemented using toroids.

2. The drive circuit of claim 1 wherein the first transformer unit comprises a first primary transformer connectable to the current pulse generation module and a second primary transformer connectable to the second transformer unit, the first and second transformer units connected to one another.

3. The drive circuit of claim 2 further comprising a third primary transformer connected between the first primary transformer and the second primary transformer.

4. The drive circuit of claim 1 wherein the first transformer unit further comprises a voltage loop connectable to a reference node of the electrical system.

5. The drive circuit of claim 2 wherein the first primary transformer comprises a first voltage loop connectable to a first reference node of the electrical system and the second primary transformer comprises a second voltage loop connectable to a second reference node of the electrical system.

6. The drive circuit of claim 5 wherein the first reference node is at the same location as the second reference node.

7. An electrical system comprising:
a gate circuit comprising:
a first transformer unit having at least one primary transformer configured to receive a current pulse at a primary winding from a current pulse generation module, the current pulse being reflected to a secondary winding of the primary transformer; and
a second transformer unit having a plurality of secondary transformers where each secondary transformer is configured to receive the current pulse at a primary winding thereof, the current pulse being reflected to a secondary winding of the secondary transformer coupled to a pulse receiver module,
wherein the first and second transformer units provide reduce coupling between a control module and the pulse receiver module;
a plurality of active power semiconductor groups connected in series, each active power semiconductor group comprising one or more semiconductor devices and connectable to the corresponding pulse receiver modules; and
wherein the primary transformers of the first transformer unit or the secondary transformers of the second transformer unit are implemented using toroids.

8. The system of claim 7 wherein the first transformer unit comprises a first primary transformer connectable to the current pulse generation module and a second primary transformer connectable to the second transformer unit, the first and second transformer units connected to one another.

9. The system of claim 8 further comprising a third primary transformer connected between the first primary transformer and the second primary transformer.

10. The system of claim 7 wherein the first transformer unit further comprises a voltage loop connectable to a reference node of the electrical system.

11. The system of claim 8 wherein the first primary transformer comprises a first voltage loop connectable to a first reference node of the electrical system and the second primary transformer comprises a second voltage loop connectable to a second reference node of the electrical system.

12. The system of claim 11 wherein the first reference node is at the same location as the second reference node.

13. A method, for driving an electrical system, comprising:
receiving, by a first transformer unit having at least one primary transformer, a current pulse at a primary winding from a current pulse generation module controlled by a control module;
communicating, to a secondary winding of the primary transformer, the current pulse;
receiving, by a second transformer unit having a plurality of secondary transformers, the current pulse at a primary winding of each secondary transformer; and
communicating, to a secondary winding of each of the secondary transformer, the current pulse wherein the secondary winding of each of the secondary transformers is configured to couple to a pulse receiver module,
wherein the first and second transformer units minimize parasitic coupling between the control module and the pulse receiver module;
wherein the primary transformers of the first transformer unit or the secondary transformers of the second transformer unit are implemented using toroids.

14. The method of claim 13 wherein the first transformer unit comprises a first primary transformer connectable to the current pulse generation module and a second primary transformer connectable to the second transformer unit, the first and second primary transformer units connected to one another.

15. The method of claim 13 wherein the first transformer unit further comprises a voltage loop connectable to a reference node of the electrical system.

16. The method of claim 14 wherein the first primary transformer comprises a first voltage loop connectable to a first reference node of the electrical system and the second primary transformer comprises a second voltage loop connectable to a second reference node of the electrical system.

* * * * *